(12) United States Patent
Tsai

(10) Patent No.: US 6,764,317 B2
(45) Date of Patent: Jul. 20, 2004

(54) ELECTRIC CONNECTOR HAVING ELASTIC PINS

(76) Inventor: Chou Hsuan Tsai, 15F, No. 4, Lane 127, Sec. 1, Fu-Hsing Rd., Hsin-Chuang City, Taipei Hsien (TW)

( * ) Notice: Subject to any disclaimer, the term of this patent is extended or adjusted under 35 U.S.C. 154(b) by 0 days.

(21) Appl. No.: 10/293,034

(22) Filed: Nov. 12, 2002

(65) Prior Publication Data
US 2003/0096518 A1 May 22, 2003

(51) Int. Cl.[7] .......................... H01R 12/00; H05K 1/00
(52) U.S. Cl. ............................................. 439/81
(58) Field of Search .................... 439/81, 83, 567, 439/570

(56) References Cited

U.S. PATENT DOCUMENTS

| | | | | | |
|---|---|---|---|---|---|
| 4,410,223 | A | * | 10/1983 | Baker | 439/81 |
| 4,629,266 | A | * | 12/1986 | Viselli | 439/81 |
| 4,875,863 | A | * | 10/1989 | Reed | 439/79 |
| 4,898,539 | A | * | 2/1990 | Glover et al. | 439/81 |

* cited by examiner

Primary Examiner—Javaid H. Nasri
(74) Attorney, Agent, or Firm—Pro-Techtor International Services

(57) ABSTRACT

An electric connector includes a base formed with a plurality of slots; and a plurality of terminals inserted into the plurality of slots of the base respectively. Each of the terminals is formed with an elastic pin protruding out of the slot. When the base is forced to contact the circuit board, the pins of the terminals retract and evenly contact the circuit board.

4 Claims, 9 Drawing Sheets

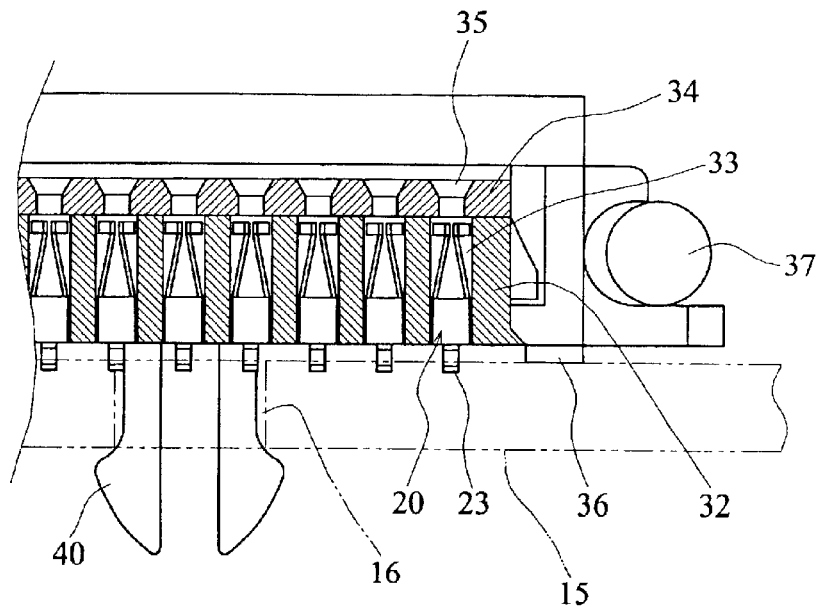
FIG. 5
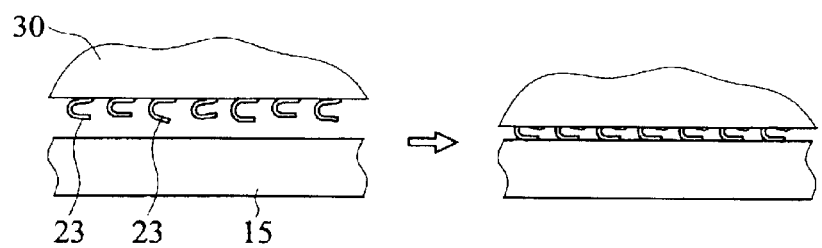
FIG. 6
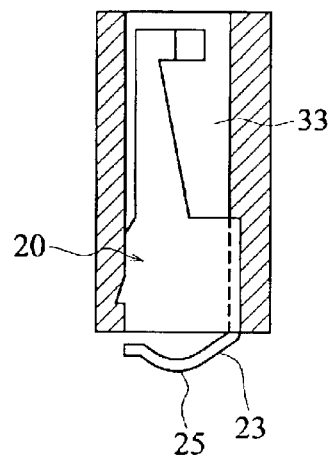 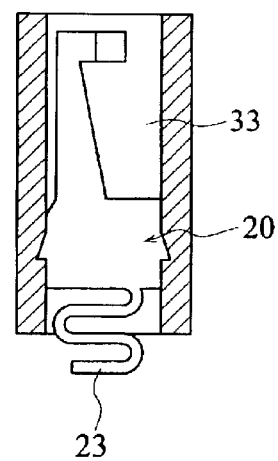
FIG. 7     FIG. 8

ELECTRIC CONNECTOR HAVING ELASTIC PINS

BACKGROUND OF THE INVENTION

1. Field of the Invention

The invention relates to an electric connector, and in particular to an electric connector having elastic pins.

2. Description of the Related Art

With the development of precise electrical products, the pin number of electric connectors increases gradually. In addition, the traces on a circuit board also become complicated because plural layers of traces are formed. Because the circuit board has plural layers of traces, instead of a through-hole connection method, a surface connection method is utilized to connect an electric connector to the circuit board in order not to influence the internal trace arrangement of the circuit board. Therefore, the number of through holes on the circuit board may be decreased, and the internal layers of the circuit board are free from being influenced.

In order to flatten the connection between the pins of the electric connector and the circuit board, it is possible to modify the pins projecting out of the plastic base into tin balls. Referring to FIG. 1, an electric connector with tin balls serving as pins includes a base 10 formed with a plurality of slots 11, each of which having a bottom surface formed with a through hole 14. The connector also includes a plurality of terminals 12 mounted within the slots 11. The lower end of each terminal 12 extends into each through hole 14. The connector further includes a plurality of tin balls 13, each of which is located partially outside the base 10 and connected to the through hole 14 and the terminal 12.

When connecting to the circuit board 15, each tin ball 13 may be partially melted to achieve good connection. Similarly, the pins of the chip may be designed to be tin balls so as to well connect to the circuit board.

Although the electric connector or chip having pins of tin ball type may perfectly connect to the circuit board, additional tin balls have to be implanted during the manufacturing processes, thereby increasing the cost relatively.

If the pins of tin ball type are not adopted, it is quite difficult to keep the flatness of all the pins. Furthermore, the pins of tin ball type also have drawbacks. That is, if the tin balls are too large, the tin balls may be connected to adjacent connection points during tin soldering, whereas the welding result may be poor if the tin balls are too small.

SUMMARY OF THE INVENTION

An object of the invention is to provide an electric connector having elastic pins and a chip structure having elastic pins. According to the elastic forces of the pins, when the pins are forced to contact a circuit board, the pins may elastically retract to evenly contact the circuit board.

To achieve the above-mentioned object, an electric connector of the invention includes a base formed with a plurality of slots; and a plurality of terminals inserted into the plurality of slots of the base respectively. Each of the terminals is formed with an elastic pin protruding out of the slot. When the base is forced to contact the circuit board, the pins of the terminals may retract and evenly contact the circuit board.

The invention also provides a chip structure having elastic pins. The chip structure includes: a package body; an integrated circuit disposed in the package body; and a plurality of pins electrically connecting to the integrated circuit and protruding out of the package body, the pins being elastically retractable. With the aid of the elastic function of each pin, the pins may be reliably and electrically connected to the circuit board.

BRIEF DESCRIPTION OF THE DRAWINGS

FIG. 5 is an enlarged front view showing the first embodiment of the invention.

FIG. 6 is a schematic illustration showing the contact relationship between the circuit board and the first embodiment of the invention.

FIG. 7 shows a second embodiment of the invention.

FIG. 8 shows a third embodiment of the invention.

DETAILED DESCRIPTION OF THE INVENTION

Figure 1:
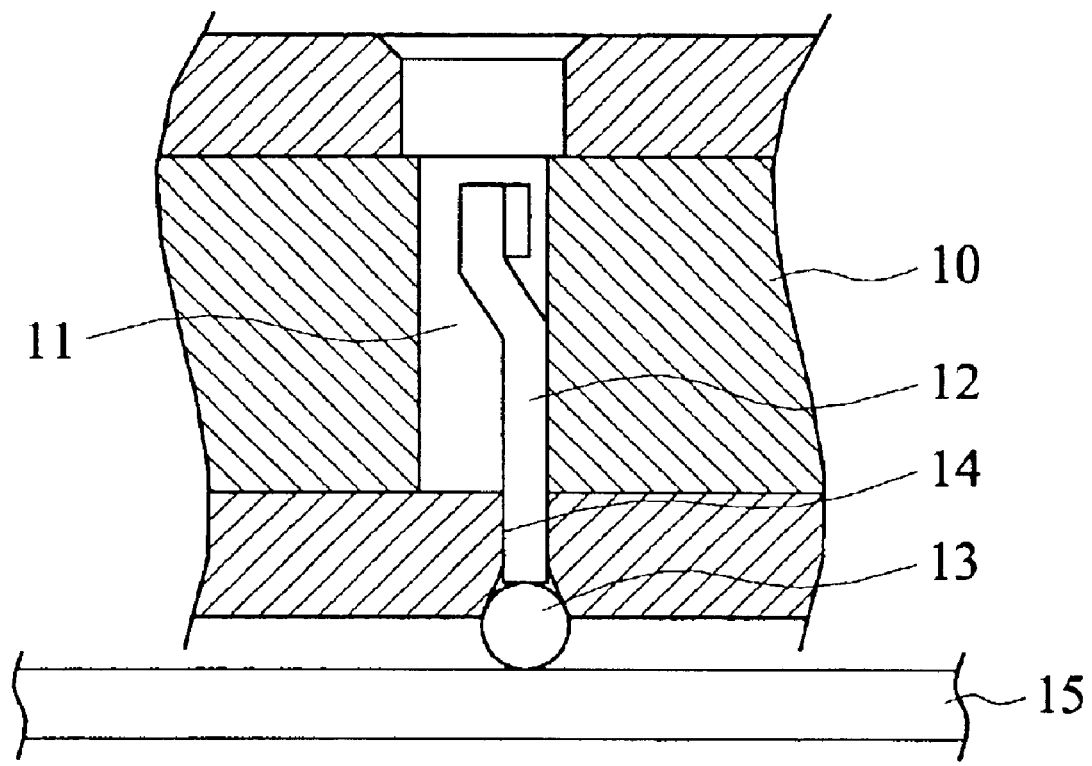
FIG. 1 shows a conventional electric connector having pins of tin ball type.
Figure 2:
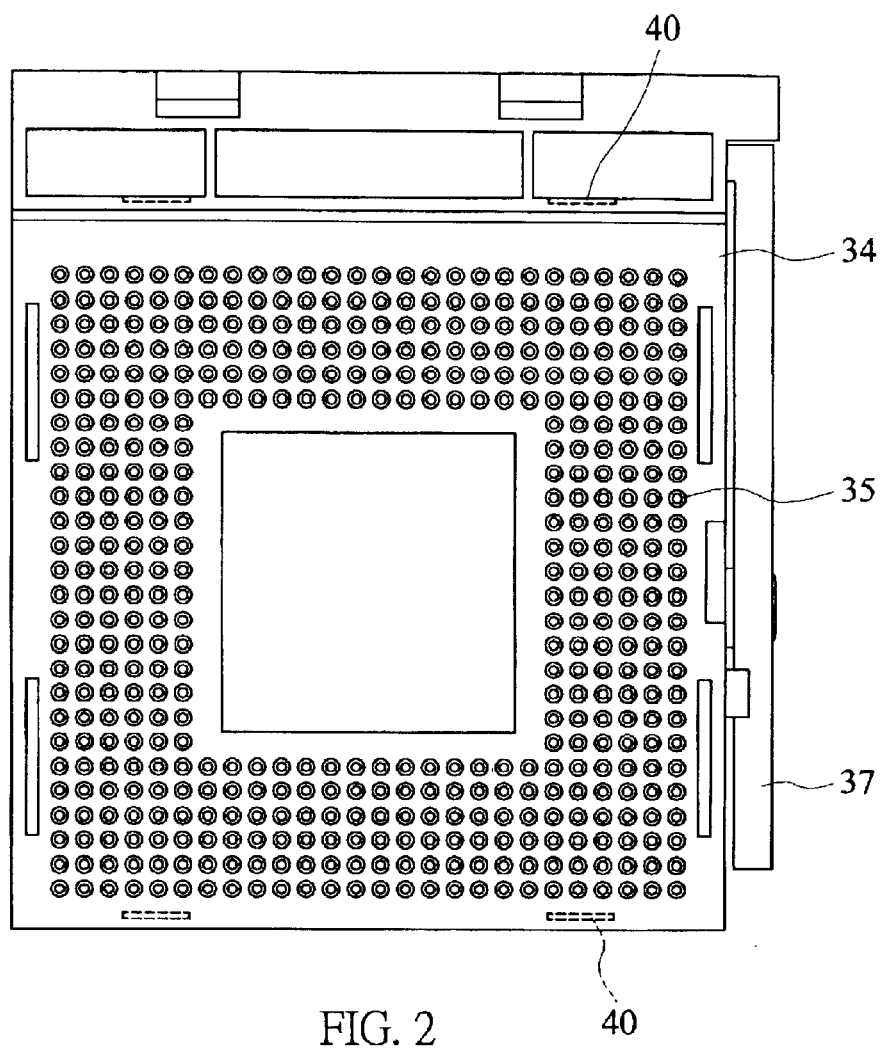
FIG. 2 is a top view showing a first embodiment of the invention.
Figure 3:
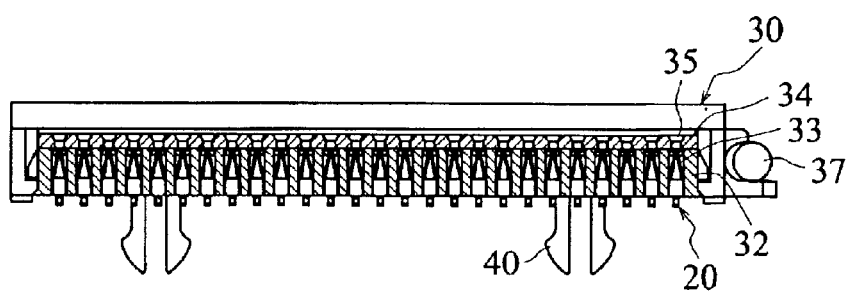
FIG. 3 is a front view showing the first embodiment of the invention.

Referring to FIGS. 2 and 3, a connector, such as a CPU connector, according to the first embodiment of the invention includes a base 30, a plurality of terminals 20 and a plurality of fasteners 40.

Referring also to FIG. 5, the base 30 includes a bed 32 and a cover 34 covering the bed 32. The bed 32 is formed with a plurality of slots 33, and pads 36 are arranged under the bottom surface of the bed 32. The cover is formed with a plurality of holes 35 corresponding to the slots 33 of the bed 32, respectively. The cover 34 and bed 32 are pivotally connected to an actuator 37, and the cover 34 may move relative to the bed 32. Because the details of the actuator 37 are not the feature of the invention, the detailed structure thereof will not be described.

Figure 4:
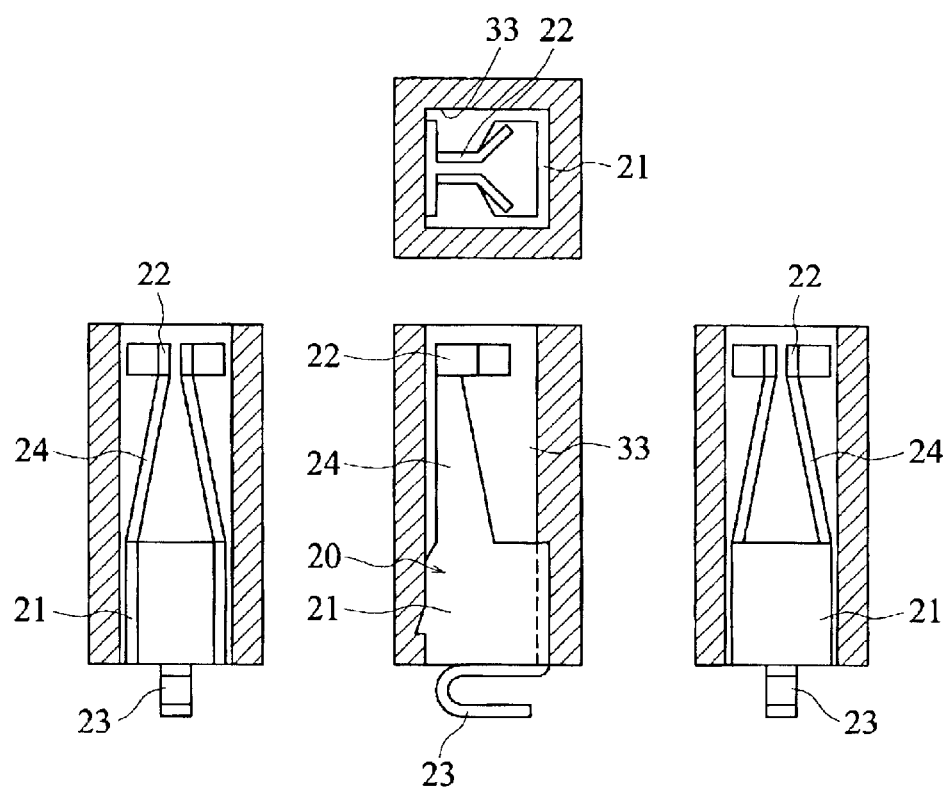
FIG. 4 shows several views of the terminal according to the first embodiment of the invention.

Please also refer to FIG. 4. The terminal 20 is mounted within the slot 33 of the base. The terminal 20 is integrally bent to form a lock portion 21, an elastic arm 24, a contact 22 and a pin 23. The lock portion is press-fitted into the slot 33, the contact 22 contacts an inserted terminal, and the pin 23 extends over the slot 33 and is bent into a U-shape structure. The pin is elastically sensitive to a small force.

When being forced, the pin may sensitively retract. It should be noted that the pin protrudes over the pad 36 on the bottom surface of the bed 32.

The fasteners 40 are mounted at four corners of the bed 32.

As shown in FIG. 5, when the fasteners 40 pass through the fastening holes 16 of the circuit board 15 to fix the base, the fastening force between the fasteners 40 and the circuit board 15 may cause the pins of the terminals 20 to elastically retract to make the pins flush with the pads 36. Therefore, all pins 23 may contact the circuit board 15 and connect to the solder tin reliably. The pins of the terminals are elastically sensitive and may be deformed under a small force. As long as the fastening force between the four fasteners 40 and the circuit board 15 is greater than the total elastic force of the terminals 20, the pins 23 of the terminals may elastically retract.

Referring to FIG. 6, if the pins 23 of the terminals are not flush with one another originally, after the base is forced on the circuit board 15, the pins 23 of the terminals may elastically retract and evenly and firmly contact the circuit board due to the good elasticity of the pins.

Referring to FIG. 7, the connector according to the second embodiment of the invention includes terminals 20 and pins 23 bent into arc-shapes to form lowermost connection points 25.

Referring to FIG. 8, the connector according to the third embodiment of the invention includes terminals 20 and S-shaped pins 23, which are formed from the plate material.

Figure 9:
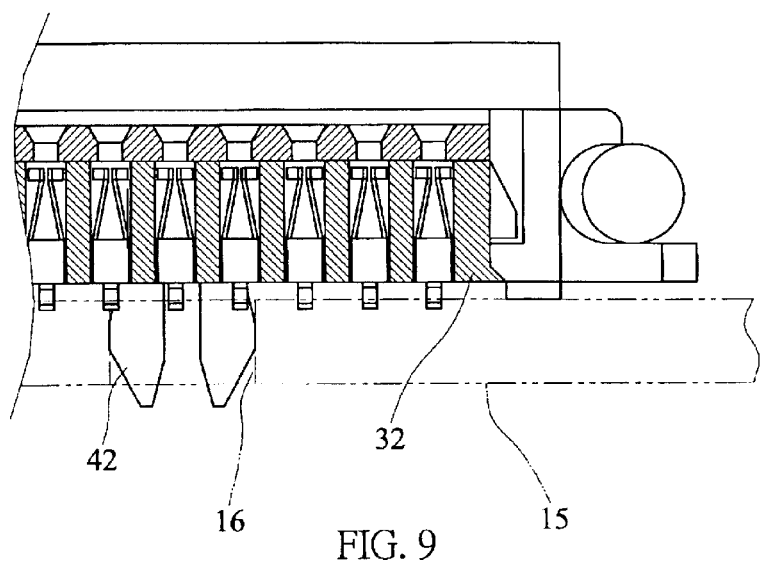
FIG. 9 shows a fourth embodiment of the invention.

Referring to FIG. 9, the connector according to the fourth embodiment of the invention includes a bed 32 formed with fasteners 42 to be elastically press-fitted to the fastening holes 16 of the circuit board 15, respectively.

Figure 10:
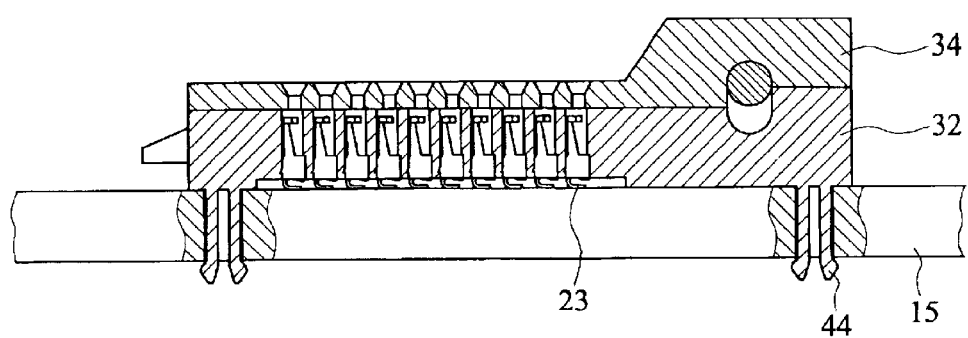
FIG. 10 shows a fifth embodiment of the invention.

Referring to FIG. 10, the connector according to the fifth embodiment of the invention includes a bed 32 having four corners formed with fasteners 44 integrally. The fasteners 44 may be fastened to the fastening holes of the circuit board 15, respectively.

Figure 11:
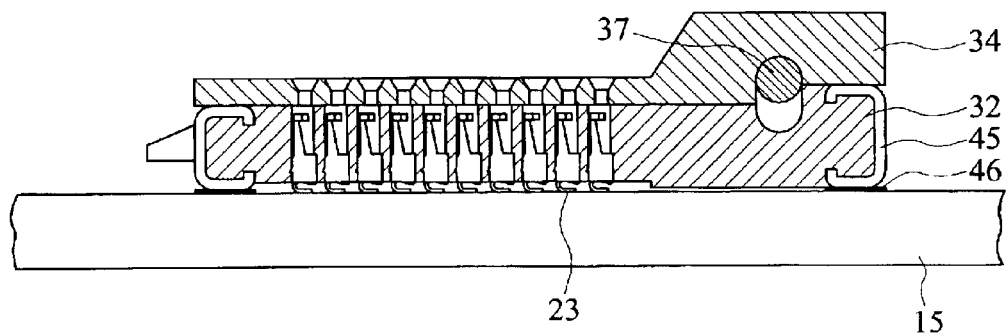
FIG. 11 shows a sixth embodiment of the invention.

Referring to FIG. 11, the connector according to the sixth embodiment of the invention includes a bed 32 having four corners formed with fixing plates 45 on which the adhesive 46 is applied to adhere the base to the circuit board. When the adhesive force is greater than the total elastic force of the pins 23 of the terminals, the pins 23 are forced to elastically retract so as to evenly contact the circuit board. In this embodiment, no fastener has to be used.

Figure 12:
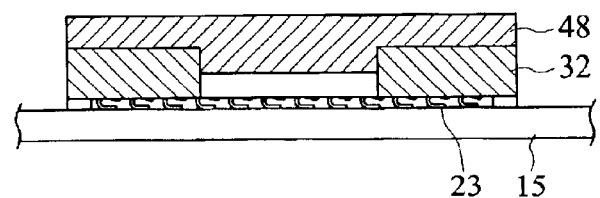
FIG. 12 shows a seventh embodiment of the invention.

Referring to FIG. 12, the connector according to the seventh embodiment of the invention includes a base 30 placed on the circuit board 15 in conjunction with the counterbalance 48. Using the gravity force of the counterbalance 48, the pins 23 of the terminals may elastically retract to evenly contact the circuit board 15.

Figure 13:
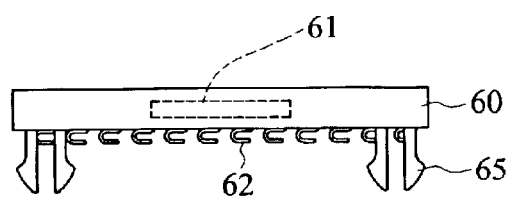
FIG. 13 shows an eighth embodiment of the invention.
Figure 16:
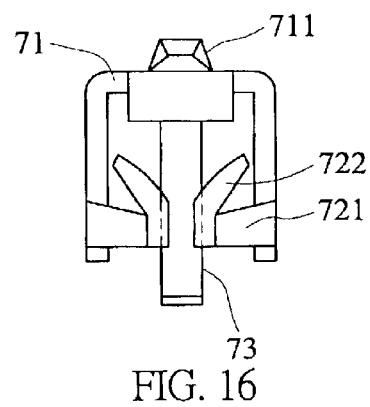
FIG. 16 is a top view showing the ninth embodiment of the invention.
Figure 17:
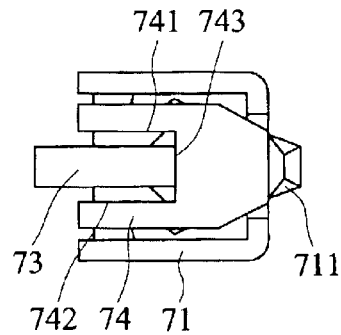
FIG. 17 is a bottom view showing the ninth embodiment of the invention.
Figure 14:
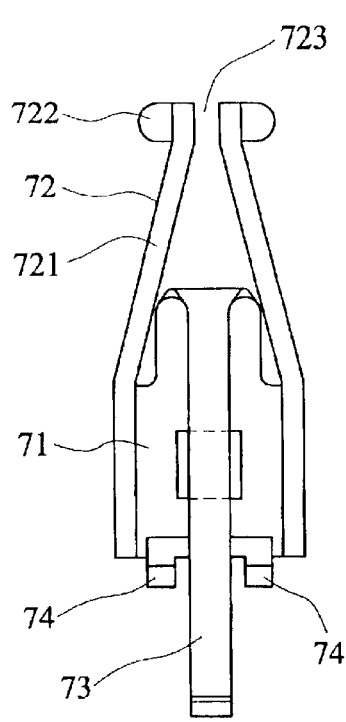
FIG. 14 is a front view showing a ninth embodiment of the invention.
Figure 15:
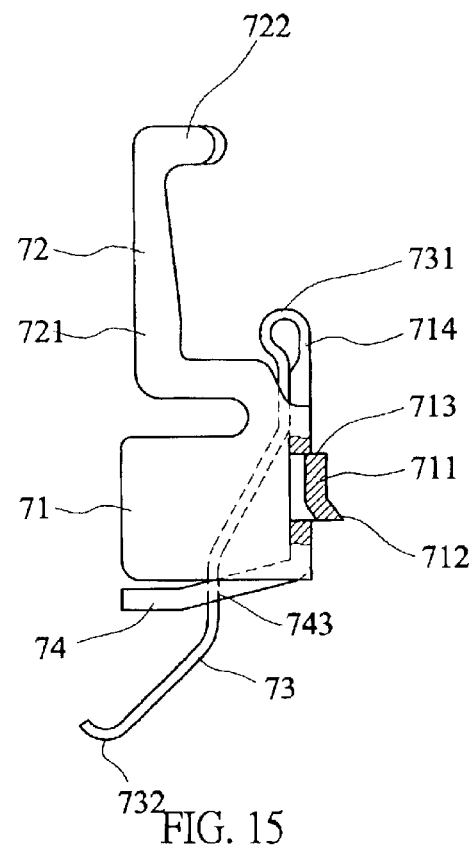
FIG. 15 is a side view showing the ninth embodiment of the invention.

Referring to FIG. 13, the chip structure having elastic pins according to the eighth embodiment of the invention includes a package body 60, an integrated circuit 61 mounted within the package body 60, a plurality of U-shaped, elastically retractable pins 62 electrically connected to the integrated circuit 61 and protruding out of the package body 60, and a plurality of fasteners 65 mounted at four corners of the package body 60.

According to the elastic actions of the pins 23, the pins 23 may elastically retract to evenly and reliably electrically connect to the circuit board when the chip is fastened to the circuit board through the fasteners 65.

In the practice of the chip structure of the invention, the pins may be configured to be of S-shapes or arc-shapes. In addition, fixing plates, on which adhesive is applied, may be provided at four corners of the package body to adhere the package body to the circuit board. Alternatively, a counterbalance may be provided to cause the pins to evenly contact the circuit board by way of the gravity force.

Referring to FIGS. 14 to 17, the connector according to the ninth embodiment of the invention includes terminals assembled into an electric connector or a packaged chip structure. The terminals are electrically connected to the circuit board, and are integrally formed using metal sheets. Each terminal includes a contact 72, a positioning unit 71, a pin 73 and a limiting plate 74.

The positioning unit 71 has three surfaces formed into an inverse U-shape. The three surfaces include two lateral surfaces and a middle surface slightly higher than the lateral surfaces. The middle surface is punched to form a fitting block 711. The fitting block has a lower end formed with a slant projection 712 and an upper end formed with an engagement surface 713.

The contact 72 extends upward from two lateral sides of the positioning unit 71 and includes a pair of elastic arms 721. A gap 723 is formed between upper ends of the pair of elastic arms 721. The upper ends of the elastic arms 721 are formed with two slant guide plates 722.

The pin 73 is bent downward and extends over the lower end of the positioning unit 71 from the upper end 714 of the middle surface of the positioning unit 71 so that a relatively long elastic arm is formed. In addition, the pin is thinned off to have a thickness which is a half of one of other plates so as to have sensitive elasticity. In addition, the pin is arced between its upper end 731 and the upper end 714 of the middle surface of the positioning unit so as to prevent the pin 73 from elastic fatigue. In addition, the lower end of the pin is formed with a contact part 732 which is convex downward.

The limiting plate 74 is connected to the lower end of the middle surface of the positioning unit 71, and bent in the transverse direction and is slightly slant. The inverse U-shaped limiting plate 74 has two lateral sides 741 and 742 and a middle side 743. The two lateral sides 741, 742 are located at two sides of the pin 73 to limit the two lateral sides and one inner side of the pin 73. The middle side 743 elastically contacts the pin 73. Therefore, even if the pin 73 is a relatively long, sensitive, elastic arm having small elasticity, the pin 73 is free from being distorted and slanted toward two lateral sides due to the limiting of the two lateral sides 741, 742.

Figure 18:
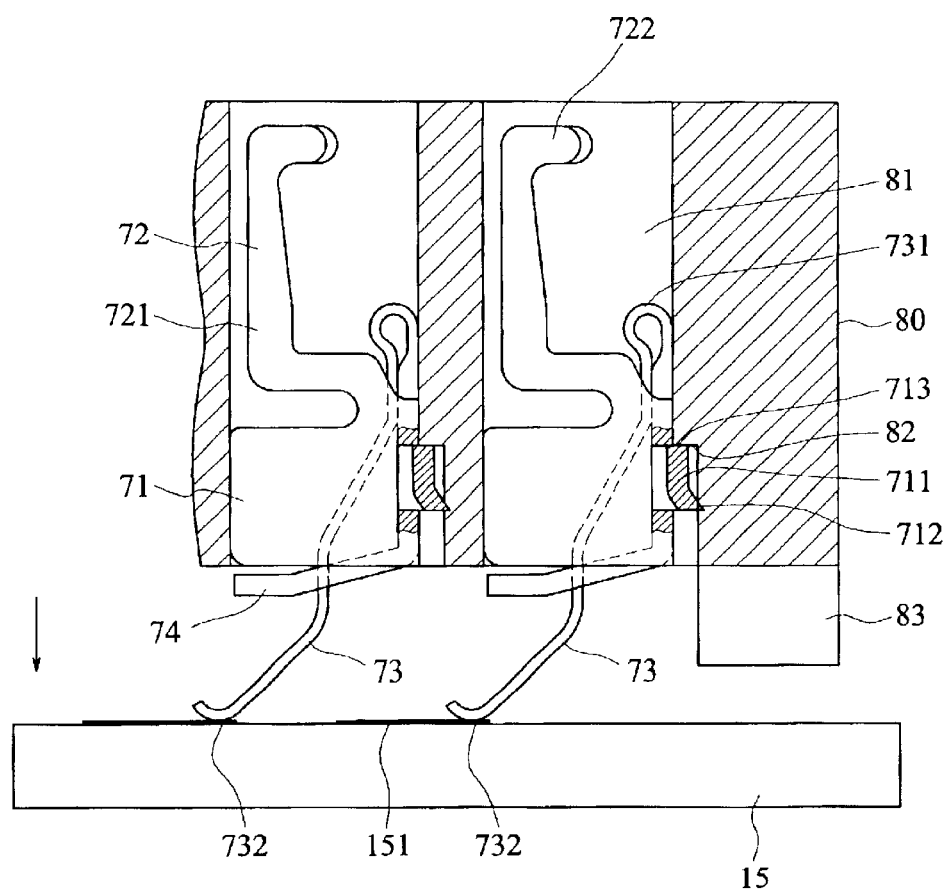
FIG. 18 shows the use state of the ninth embodiment of the invention.
Figure 19:
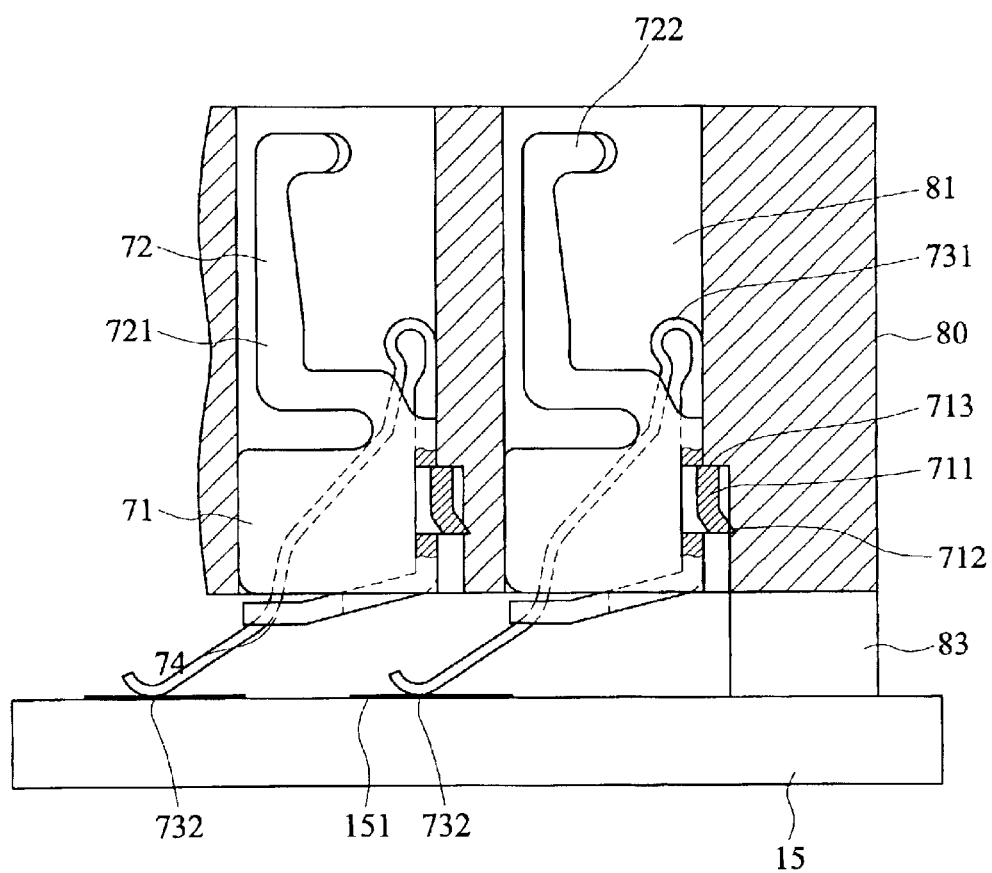
FIG. 19 shows the use state of the ninth embodiment of the invention.

Referring to FIG. 18, the above-mentioned terminal is assembled in the terminal slot 81 of the base 80 of the electric connector from bottom to top. The positioning unit 71 is forced to contact the terminal slot 81 through the slant projection 712 and is positioned on the engagement surface 82 within the terminal slot 81 through the engagement surface 713. The pin 73 protrudes out of the terminal slot 81. When the pin 73 contacts the circuit board 15, the contact part 732 thereof only contacts the periphery of the connection point 151 of the circuit board 15. Please refer to FIG. 19. After the electric connector is pressed downward, the heat-dissipation pad 83 on the bottom surface of the base may contact the circuit board 15. At this time, the pin 73 is compressed and its contact part 732 may elastically and substantially contact the middle portion of the connection point 151 of the circuit board. Accordingly, reliable electric connection may be obtained.

The invention has the following advantages.

1. The pins of the invention are elastically sensitive and retractable. As long as a force is slightly greater than the total elastic force of the pins, the pins may elastically retract to elastic contact the circuit board. To achieve the purpose, there are several ways to be selected.

2. The elastic connection of the invention has good effect, and the manufacturing cost is low relative to that of the pins of the tin ball type.

3. Since the pins contact the circuit board using the elastic forces thereof and have a retractable range of elastic contact, good and uniform electric connections between the pins and the circuit board may be achieved even if the number of pins is great. On the other hand, even if the pins are not evenly made, the retractable range of elastic contact may compensate this condition so as to avoid poor connections.

4. The pins of the terminals of the invention extend downward and protrude out of the lower end of the positioning unit from the upper end of the positioning unit, so relatively long elastic arms may be obtained to possess relatively sensitive, elastic effects.

While the invention has been described by way of example and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. An electric connector, comprising:

a base formed with a plurality of slots; and a plurality of terminals inserted into the plurality of slots of the base, respectively, each of the terminals being formed with an elastic pin protruding out of the slot, wherein when the base is forced to contact a circuit board, the pins of the terminals retract and evenly contact the circuit board, the base includes a cover and a bed, the bed is formed with the plurality of slots, the cover is formed with a plurality of holes corresponding to the slots of the bed, the cover and bed are pivotally connected to an actuator, and the cover may move relative to the bed.

2. A terminal structure having a contact, a positioning unit, and an elastic pin for electrically connecting to a circuit board, characterized in that:

the pin is bent downward and extends over a lower end of the positioning unit from an upper end of the positioning unit;

the pin is thinned to have sensitive elasticity;

a connection between an upper end of the pin and the upper end of the positioning unit is arced;

the positioning unit includes three surfaces to form an inverse U-shape;

the middle one of the three surfaces of the positioning unit is punched to form a fitting block;

the pin is formed with a contact part which is convex downward; and the lower end of the positioning unit is connected to a limiting plate, the limiting plate extends toward two lateral sides of the pin to limit the pin from being distorted and slanted toward the two lateral sides.

3. The terminal structure according to claim 2, wherein the limiting plate is in the form of an inverse U-shape to limit the pin by three sides of the limiting plate.

4. The terminal structure according to claim 3, wherein:

the contact extends upward from two lateral sides of the positioning unit and is formed with a pair of elastic arms;

a gap is formed between upper ends of the pair of elastic arms; and each of the elastic arms is formed with a slant guide plate at the upper end thereof.

* * * * *